United States Patent
Tsutsue

(10) Patent No.: US 7,989,334 B2
(45) Date of Patent: *Aug. 2, 2011

(54) METHOD OF MANUFACTURING SEMICONDUCTOR DEVICE

(75) Inventor: Makoto Tsutsue, Shiga (JP)

(73) Assignee: Panasonic Corporation, Osaka (JP)

( * ) Notice: Subject to any disclaimer, the term of this patent is extended or adjusted under 35 U.S.C. 154(b) by 33 days.

This patent is subject to a terminal disclaimer.

(21) Appl. No.: 12/399,425

(22) Filed: Mar. 6, 2009

(65) Prior Publication Data

US 2009/0181536 A1    Jul. 16, 2009

Related U.S. Application Data

(63) Continuation of application No. 12/136,267, filed on Jun. 10, 2008, now Pat. No. 7,524,752.

(30) Foreign Application Priority Data

Jun. 25, 2007  (JP) ................. 2007-165726

(51) Int. Cl.
*H01L 21/44* (2006.01)

(52) U.S. Cl. ........ 438/597; 438/618; 438/624; 438/633; 438/638; 257/E21.579

(58) Field of Classification Search ................. None
See application file for complete search history.

(56) References Cited

U.S. PATENT DOCUMENTS

| | | | |
|---|---|---|---|
| 6,001,733 A | 12/1999 | Huang et al. | 438/633 |
| 6,451,688 B1 * | 9/2002 | Shimpuku | 438/624 |
| 7,524,752 B2 * | 4/2009 | Tsutsue | 438/597 |
| 2001/0029105 A1 * | 10/2001 | Seta et al. | 438/694 |

FOREIGN PATENT DOCUMENTS

JP    2006-294965    10/2006

* cited by examiner

*Primary Examiner* — N Drew Richards
*Assistant Examiner* — Kyoung Lee
(74) *Attorney, Agent, or Firm* — Steptoe & Johnson LLP

(57) ABSTRACT

In a method of manufacturing a semiconductor device which method is made up of a process of forming a wiring groove using a hard mask, a metal hard mask 107 is used to form a wiring groove 111, allowing the shape of the wiring groove 111 to be stabilized. Furthermore, a part or all of the metal hard mask 107 is removed before the formation of TaN and Cu layers in the wiring groove 111. This enables a reduction in possible damage, which may increase the dielectric constant of the surface of low-dielectric-constant film, and thus in possible inter-wire leakage current. As a result, a reliable semiconductor device can be provided.

8 Claims, 9 Drawing Sheets

US 7,989,334 B2

METHOD OF MANUFACTURING SEMICONDUCTOR DEVICE

REFERENCE TO RELATED APPLICATION

This application is a continuation of application Ser. No. 12/136,267, filed Jun. 10, 2008, which application claims priority to Japanese Application No. 2007-165726, filed Jun. 25, 2007, each of which is incorporated herein by reference in their entirety.

FIELD OF THE INVENTION

The present invention relates to a method of manufacturing a semiconductor device having a damascene structure.

BACKGROUND OF THE INVENTION

With the reduced size of a wiring structure and the increased number of layers in the wiring structure, much effort has recently been made to further integrate a semiconductor integrated circuit. As a method of forming a dense wiring pattern or a multilayer wiring structure, a damascene process is commonly used which forms wiring by using Cu as a wiring material and flattening the wiring material by means of CMP (Chemical Mechanical Polishing). On the other hand, the denser wiring pattern has disadvantageously increased a parasitic capacitance generated between wires. The increased parasitic capacitance reduces a speed at which signals are transmitted through the wiring. Thus, for the semiconductor integrated circuit which requires high-speed operations, it is important to reduce the parasitic capacitance between the wires.

For a method of reducing the parasitic capacitance between the wires, the use of a material with a low dielectric constant for an inter-wire insulating film and an interlayer insulating film has been considered. A silicon oxide ($SiO_2$) film (dielectric constant: 3.9 to 4.2) has often been used as the inter-wire insulating film. In some semiconductor integrated circuits, an $SiO_2$ film containing fluorine (F) (dielectric constant: 3.5 to 3.8) is used as an inter-wire insulating film that enables a reduction in dielectric constant as compared to the conventional $SiO_2$ film. Moreover, to further reduce the electric parasitic capacitance between the wires, a proposal has been made of a semiconductor device using, as the inter-wire insulating film, a low-dielectric-constant film made up of a carbon-containing silicon oxide (SiOC) film with a dielectric constant of 3 or less.

A method of manufacturing the conventional semiconductor device will be described below with reference to FIGS. 6, 7A, 7B, 7C, 7D, 7E, 7F, 8A, 8B, 8C, and 8D.

FIG. 6 is a sectional view showing the wiring structure of the conventional semiconductor device. FIGS. 7A, 7B, 7C, 7D, 7E, 7F, 8A, 8B, 8C, and 8D are sectional views showing the process of the method of manufacturing the conventional semiconductor device.

FIG. 6 shows the cross section of the wiring structure of the semiconductor device using the SiOC film as the inter-wire insulating film. In FIG. 6, a first insulating film 1 made up of an SiOC film is formed on a substrate (not shown) made up of silicon. A first metal wire 4 is formed in the first insulating film 1 and composed of a barrier metal 2 made up of tantalum nitride (TaN) and a conductive film 3 made up of copper (Cu). A second insulating film 5 is formed on the first insulating film 1 so as to cover the first metal wire 4; the second insulating film 5 is made up of silicon oxide containing carbon and nitrogen (SiCON) and functions as a metal diffusion preventing film. A third insulating film 6 made up of SiOC with a low dielectric constant is formed on the second insulating film 5. Here, a second metal wire 13 is formed in the third insulating film 6 and composed of a barrier metal 11 made up of TaN and a conductive film 12 made up of Cu. Furthermore, a metal via 14 is formed through the second insulating film 5 and the third insulating film 6 to connect the first metal wire 4 and the second metal wire 13 together. Finally, a fourth insulating film 15 is formed on the third insulating film 6. A pad electrode 16 made up of Al is formed in an opening in the fourth insulating film 15.

FIGS. 7A, 7B, 7C, 7D, 7E, 7F, 8A, 8B, 8C, and 8D show the sectional states of the respective steps of the method of manufacturing the semiconductor device shown in FIG. 6.

First, as shown in FIG. 7A, a wiring groove pattern is formed, by photolithography, on the first insulating film 1 formed on the substrate (not shown) and made up of SiOC. Subsequently, the first insulating film 1 is selectively etched by dry etching. Resist is then removed by ashing and cleaning to form a wiring groove. The barrier metal 2 made up of TaN and the conductive film 3 made up of Cu, are deposited so as to bury the wiring groove. Excess Cu is then removed by chemical mechanical polishing (CMP) to form the first metal wire 4.

Then, as shown in FIG. 7B, the second insulating film 5 made up of SiCON is deposited on the first insulating film 1 so as to cover the first metal wire 4. The third insulating film 6 is deposited, which is made up of SiOC and exhibits a low dielectric constant.

Then, as shown in FIG. 7C, a resist 7 is coated on the third insulating film 6, and a via pattern is formed in the resist 7 by photolithography. The insulating film 6 is subsequently etched by dry etching. The excess part of the resist is removed by ashing and cleaning to form a via hole 8 (FIG. 7D).

Then, as shown in FIG. 7E, a resist 9 is coated on the third insulating film 6, and a wiring pattern is formed in the resist 9 by photolithography. A wiring groove 10 used to form a second wire is formed in the third insulating film 6 by dry etching. The excess part of the resist 9 is then removed by ashing and cleaning (FIG. 7F).

Subsequently, the second insulating film 5 exposed at the bottom of the via hole 8 is etched away to complete the formation of the wire and via pattern in the second and third insulating films 5 and 6 (FIG. 8A).

Subsequently, as shown in FIG. 8B, the barrier metal 11 made up of TaN and the conductive film 12 made up of Cu are deposited so as to bury the wiring groove 10 and the via hole 8. The excess parts of Cu and TaN are then removed by chemical mechanical polishing (CMP) to form the second metal wire 13 and the via 14 as shown in FIG. 8C.

Finally, the fourth insulating film 15 made up of SiN is formed as a passivation film. The fourth insulating film 15 is partly formed into an opening by photolithography and etching. The Al pad electrode 16 is formed in the opening to complete a semiconductor device (FIG. 8D).

In general, a low-dielectric-constant film is likely to be damaged during the wiring process such as etching and ashing, resulting in an increase in dielectric constant. This makes it difficult to reduce the parasitic capacitance. Disadvantageously, such damage may be particularly affected by a process of patterning the wire using a resist mask. In the damascene process using the resist mask as described above, the low-dielectric-constant film in side walls of the wiring groove may be damaged by the ashing and cleaning process carried out after etching during the wire and via patterning steps using the resist mask. This increases the dielectric constant of the low-dielectric-constant insulating film and thus the effective dielectric constant of the wiring structure.

Thus, a proposal has been made of a wiring patterning process using a hard mask in order to eliminate or reduce the adverse effect of the damage during the process as described above.

As an example of a solution, description will be given of a damascene process of performing the conventional wire patterning using an insulating film hard mask. This method first uses the resist mask to form the wiring pattern on the insulating film hard mask, then ashes away the resist mask before forming the wiring groove pattern in the interlayer insulating film by etching, and then forms the wiring groove pattern in the interlayer insulating film by etching. According to this method, the resist mask is ashed away with the interlayer insulating film unexposed in the wiring groove. This enables a reduction in damage to the low-dielectric-constant insulating film in the side walls in the wiring groove due to ashing, which has been a problem with the process using the resist mask. The damascene process is thus characterized by using the interlayer insulating film with the low dielectric constant to provide a semiconductor device having the wiring structure with low effective dielectric constant.

DISCLOSURE OF THE INVENTION

However, in the conventional wire patterning process using the insulating film hard mask, the etching selection ratio of the insulating film hard mask to the interlayer insulating film is low. Thus, disadvantageously, the film thickness of the insulating film hard mask needs to be increased. Furthermore, the corners of the hard mask may be curled during the processing of the interlayer insulating film. Thus, the patterning shape may be unstable.

An object of the present invention is to provide a method of manufacturing a semiconductor device, by which, in a wiring structure forming process using a hard mask, damage that may increase the dielectric constant of a low-dielectric-constant insulating film is reduced, while stabilizing a processing shape.

To accomplish the object, the present invention provides a method of manufacturing a semiconductor device, in which a wiring structure is formed by a damascene process, the method including, to form the wiring structure, the steps of forming an insulating film on a semiconductor substrate or on a lower wiring layer, depositing a metal hard mask on the insulating film, using a first resist pattern to form the metal hard mask into a predetermined wiring pattern, forming a second resist pattern with a via pattern formed therein, on the insulating film and the metal hard mask, using the second resist pattern to form a via hole in the insulating film, removing the second resist pattern, forming a wiring groove in the insulating film through the metal hard mask, thinning the metal hard mask, forming a barrier metal and a conductive film in the via hole and the wiring groove, and removing parts of the barrier metal and the conductive film which stick out from the via hole and the wiring groove.

The method further includes the step of removing all of the metal hard mask, between the step of forming the wiring groove and the step of forming the barrier metal and the conductive film.

Furthermore, the step of thinning the metal hard mask or removing all of the metal hard mask is carried out by CMP.

Furthermore, the step of thinning the metal hard mask or removing all of the metal hard mask is carried out by etching.

Furthermore, in the step of thinning the metal hard mask or removing all of the metal hard mask, an opening in the metal hard mask is filled with an organic film before the metal hard mask is removed.

Furthermore, the metal hard mask contains at least one of Ti, TiN, Ta, and TaN.

DESCRIPTION OF THE EMBODIMENTS

Figure 1:
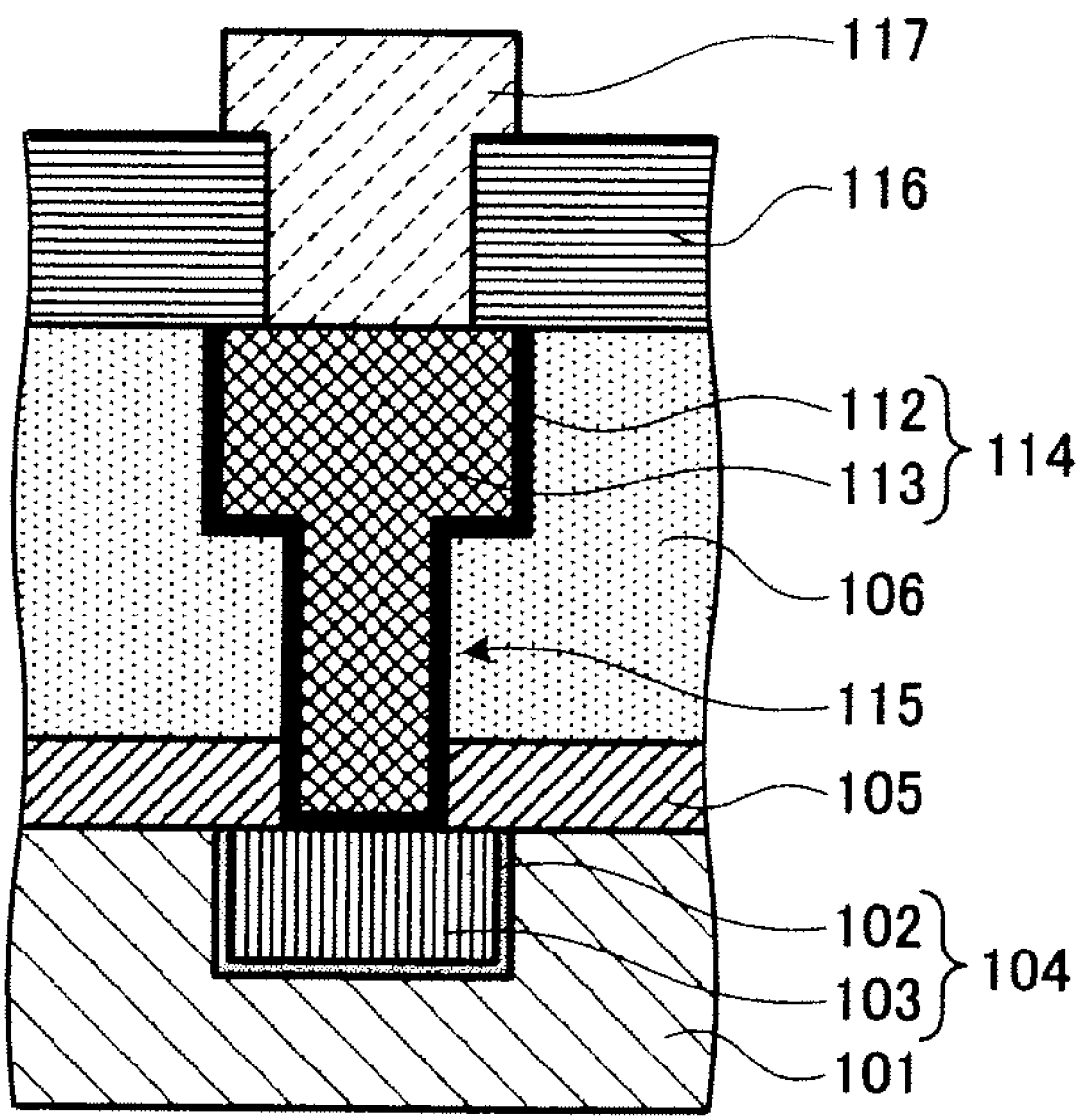
FIG. 1 is a sectional view showing the wiring structure of a semiconductor device according to the present invention.

The present invention uses a process of forming a wiring groove using a metal hard mask, and removes a part or all of the metal hard mask before a TaN barrier and a Cu being a conductive film are formed.

Specifically, a method of manufacturing a semiconductor device according to the present invention is directed to a semiconductor manufacturing method comprising the steps of forming a first insulating film on a substrate which has a first wire and exhibits a dielectric constant of 3 or less, a second insulating film on the first insulating film, a third insulating film on the second insulating film which exhibits a dielectric constant of 3 or less, and a groove for a second wire in the third insulating film using a metal hard mask, burying metal such as Cu in the groove to form the second wire, and removing excess metal. The method is characterized in that the metal hard mask is removed before the wire is formed using the metal such as Cu.

In the semiconductor device according to the present invention, the wiring groove is formed using the metal hard mask. Consequently, an etching selection ratio for the wiring groove can be increased, and the shape of the hard mask is not substantially changed during the etching of the wiring groove. Thus, the shape of the wiring groove can be stably processed.

A low-dielectric-constant film is known to exhibit the following characteristics. Since the low-dielectric-constant film generally has a low mechanical strength, the mechanical strength needs to be increased by irradiating the film with UV light or the like. Nevertheless, the irradiation of the film with an excessive quantity of UV light also increases the dielectric constant. However, a conventional resist mask and insulating film hard mask allow light from various light sources used for a lithography step to pass through. Thus, the low-dielectric-constant film, formed immediately below the patterning mask, may disadvantageously be affected and modified by the light source for a patterning step. In contrast, the metal hard mask blocks light. Thus, the use of the metal hard mask is expected to exert the effect of preventing the film quality of the low-dielectric-constant film from being changed during the patterning step as described above.

Furthermore, in CMP used for a damascene process using Cu, excessive polishing is generally performed in order to prevent barrier metal or Cu from being insufficiently polished by a step in a lower film or a variation in film thickness. In this case, the low-dielectric-constant film is exposed for polishing. Thus, the excessive polishing may cause a defect such as a scratch on the surface of the low-dielectric-constant film. However, in the conventional hard mask process, the formation of the wire is followed by the formation of the barrier metal and conductive film on the remaining metal hard mask. This increases the thickness of the film to be polished by CMP. Consequently, the CMP time required to polish the barrier metal and conductive film increases, resulting in the need to increase the time for the excessive polishing required to prevent insufficient polishing. This may increase the number of defects on the surface of the low-dielectric-constant film, a variation in polishing, or a variation in wiring shape. In contrast, with the method of manufacturing the semiconductor device according to the present invention, a part or all of the metal hard mask is removed before the TaN barrier and the Cu are formed in the second wiring groove. Thus, in the normal step of removing metals such as TiN and Cu by means of CMP, the amounts of materials polished at a time can be sharply reduced. This enables a reduction in a variation in CMP and thus in possible damage resulting from the polishing of the low-dielectric-constant film. As a result, a reliable semiconductor device with stable electrical characteristics can be provided.

Furthermore, in the method of manufacturing the semiconductor device according to the present invention, the metal hard mask, formed after the formation of the third insulating film, is preferably composed of at least one of Ti, TiN, Ta, and TaN. These materials are commonly used as a diffusion preventing film that prevents the diffusion of Cu or the like, that is, a wiring material. Thus, the hard mask can be formed without the need to introduce new materials or facilities. The third insulating film can be highly selectively patterned, allowing the wiring groove to be accurately processed into a stable shape.

In the method of manufacturing the semiconductor device according to the present invention, a part or all of the metal hard mask is preferably removed by CMP. The manufacturing method allows the use of a barrier metal CMP process for TaN or the like which is commonly used for the damascene process using Cu. Furthermore, the metal hard mask can be uniformly removed.

Furthermore, in the method of manufacturing the semiconductor device according to the present invention, thinning or removal of the metal hard mask is preferably performed with an opening in the hard mask pre-filled with an organic film or the like. The manufacturing method allows the hard mask to be more uniformly removed by CMP or etching.

Now, a first embodiment of the present invention will be described below in detail with reference to FIGS. 1 to 5.

Figure 4:
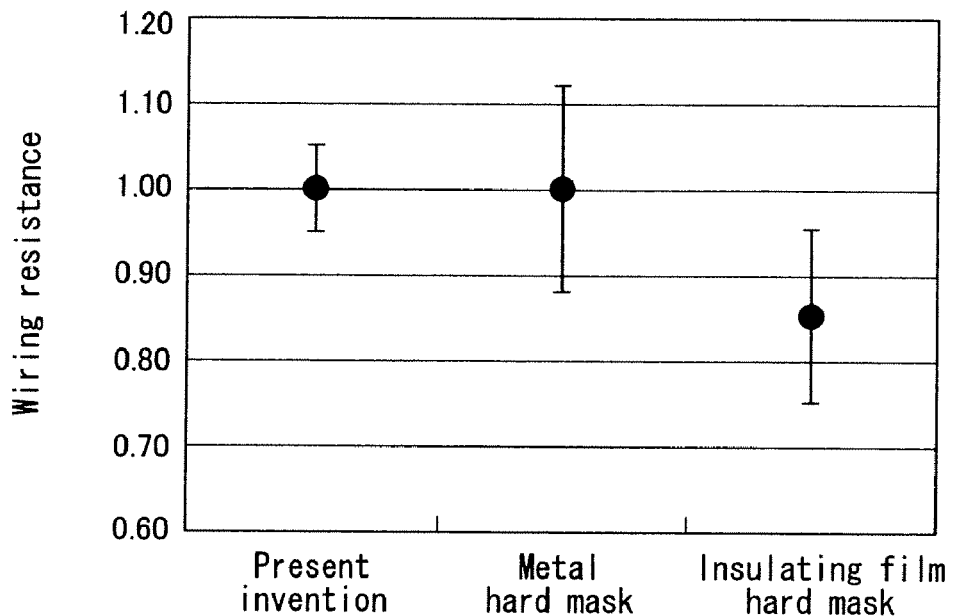
FIG. 4 is a diagram illustrating the characteristics of the wiring resistance of the wiring structure formed according to the present invention.
Figure 5:
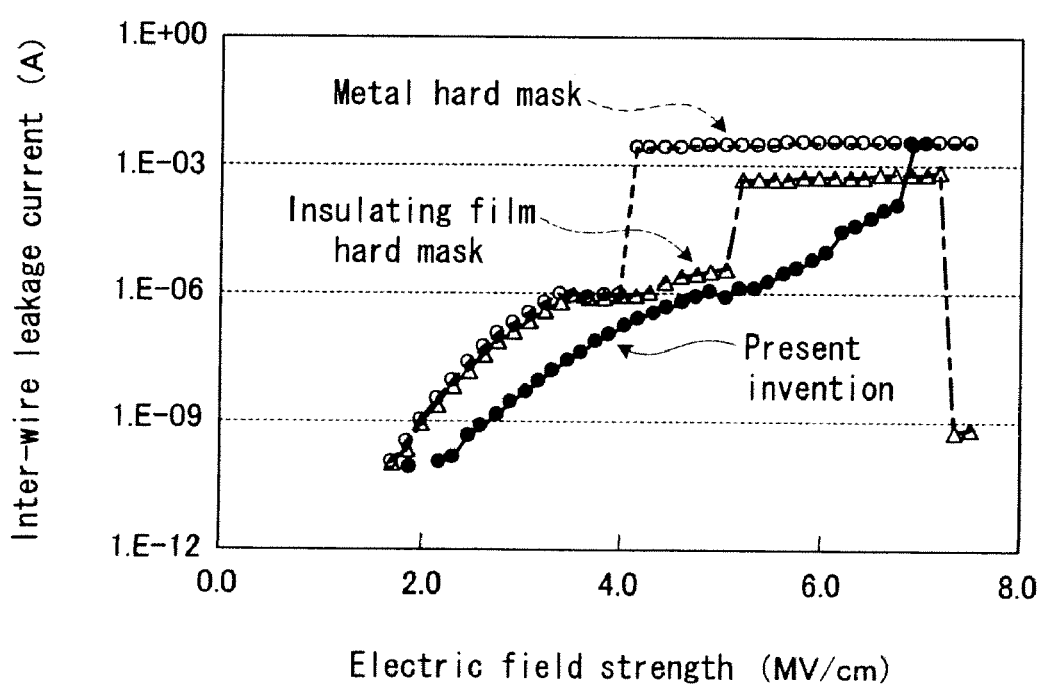
FIG. 5 is a diagram comparably illustrating the relationship between electric field strength and inter-wire leakage current.
Figure 6:
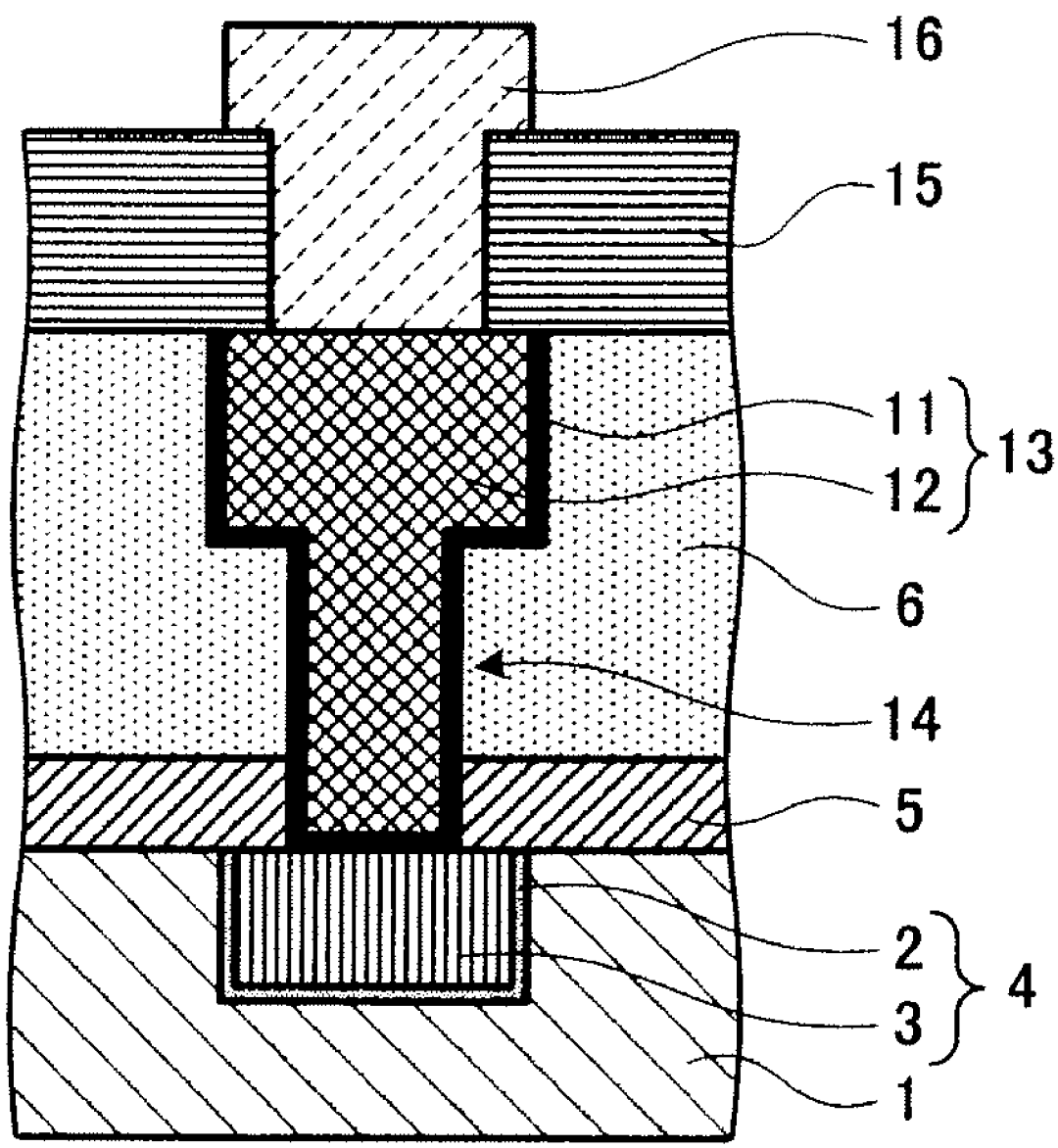
FIG. 6 is a sectional view showing the wiring structure of a conventional semiconductor device.
Figure 7A:
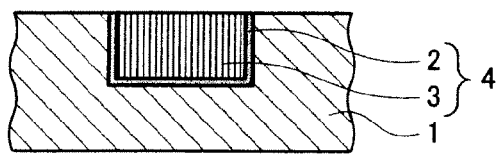
FIG. 7A is a sectional view showing a step of a method of manufacturing the conventional semiconductor device.
Figure 7B:
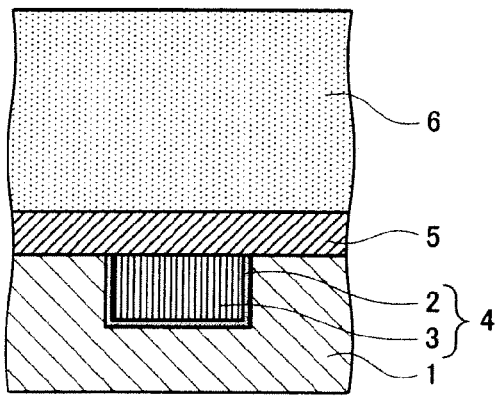
FIG. 7B is a sectional view showing a step of the method of manufacturing the conventional semiconductor device.
Figure 7C:
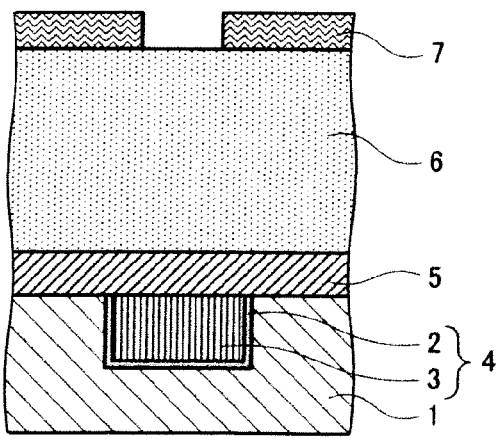
FIG. 7C is a sectional view showing a step of the method of manufacturing the conventional semiconductor device.
Figure 7D:
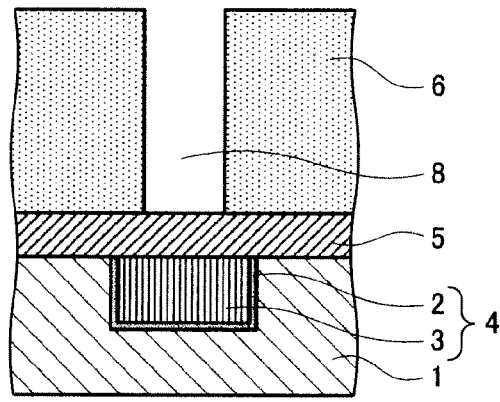
FIG. 7D is a sectional view showing a step of the method of manufacturing the conventional semiconductor device.
Figure 7E:
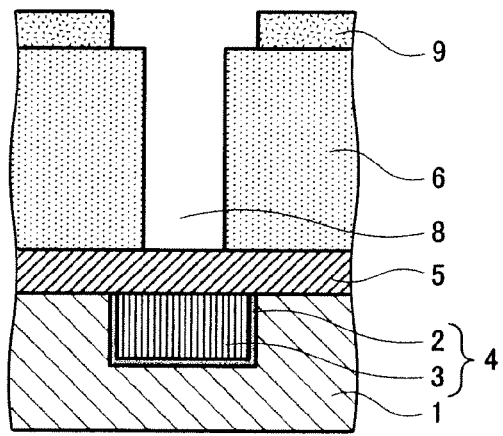
FIG. 7E is a sectional view showing a step of the method of manufacturing the conventional semiconductor device.
Figure 7F:
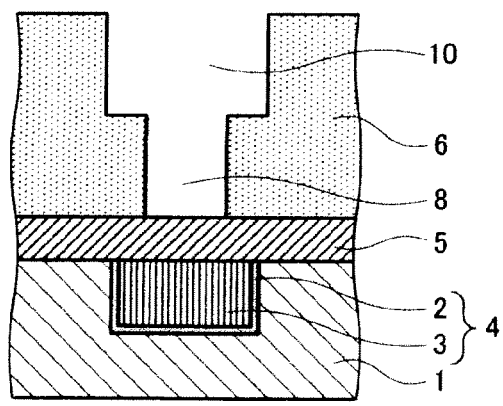
FIG. 7F is a sectional view showing a step of the method of manufacturing the conventional semiconductor device.
Figure 8A:
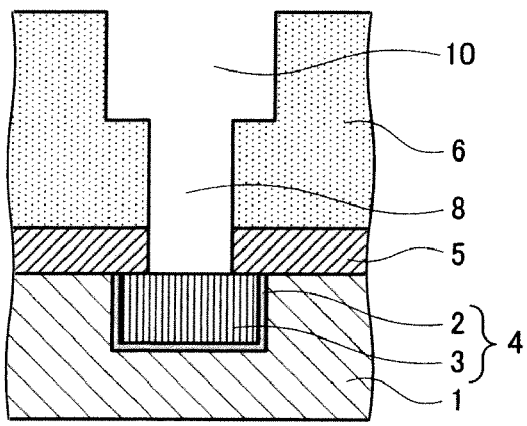
FIG. 8A is a sectional view showing a step of the method of manufacturing the conventional semiconductor device.
Figure 8C:
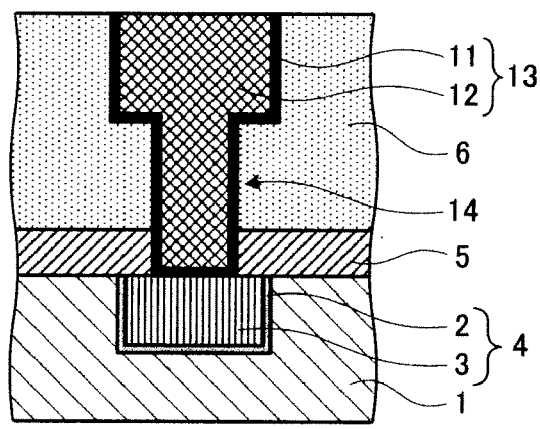
FIG. 8C is a sectional view showing a step of the method of manufacturing the conventional semiconductor device.
Figure 8B:
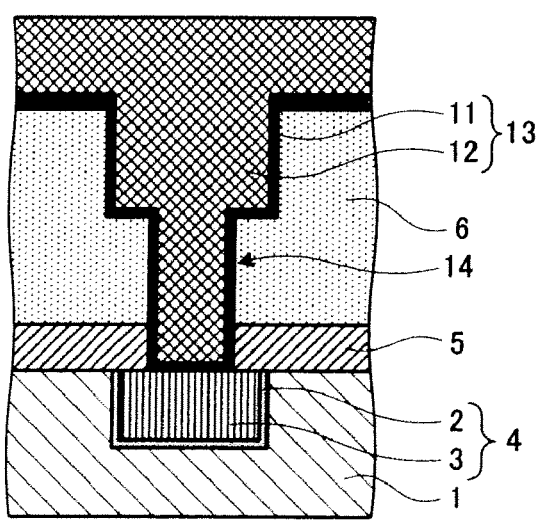
FIG. 8B is a sectional view showing a step of the method of manufacturing the conventional semiconductor device.
Figure 8D:
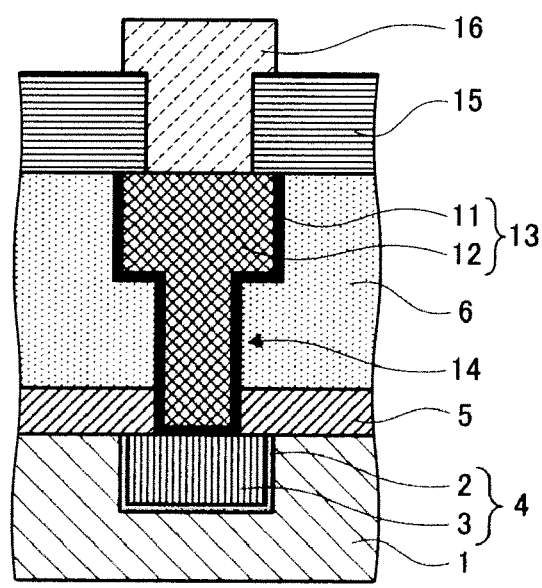
FIG. 8D is a sectional view showing a step of the method of manufacturing the conventional semiconductor device.

FIG. 1 is a sectional view showing the wiring structure of the semiconductor device according to the present invention. FIGS. 2A, 2B, 2C, 2D, 2E, 2F, 3A, 3B, 3C, 3D, 3E, and 3F are sectional views showing the steps of the method of manufacturing the semiconductor device according to the first embodiment of the present invention. FIG. 4 is a diagram illustrating the characteristics of the wiring resistance of the wiring structure formed according to the present invention. FIG. 5 is a diagram comparably illustrating the relationship between electric field strength and inter-wire leakage current.

FIG. 1 shows a cross section of the wiring structure of the semiconductor device using an SiOC film as an inter-wire insulating film. In FIG. 1, a first insulating film 101 made up of the SiOC film is formed on a substrate (not shown) made up of silicon. A first metal wire 104 is formed in the first insulating film 101 and composed of a barrier metal 102 made up of tantalum nitride (TaN) and a conductive film 103 made up of copper (Cu). A second insulating film 105 is formed on the first insulating film 101 so as to cover the first metal wire 104; the second insulating film 105 is made up of silicon oxide containing carbon and nitrogen (SiCON) and functions as a metal diffusion preventing film. A third insulating film 106 made up of SiOC with a low dielectric constant is formed on the second insulating film 105. Here, a second metal wire 114 is formed in the third insulating film 106 and composed of a barrier metal 112 made up of TaN and a conductive film 113 made up of Cu. Furthermore, a metal via 115 is formed through the second insulating film 105 and the third insulating film 106 to connect the first metal wire 104 and the second metal wire 114 together. Finally, a fourth insulating film 116 is formed on the third insulating film 106. A pad electrode 117 made up of Al is formed in an opening in the fourth insulating film 116.

Now, with reference to FIGS. 2 and 3, description will be given of the method of manufacturing the semiconductor device according to the present invention.

Figure 2A:
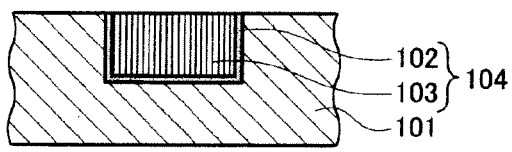
FIG. 2A is a sectional view showing a step of a method of manufacturing a semiconductor device according to a first embodiment of the present invention.

First, as shown in FIG. 2A, the first insulating film 101, made up of a carbon-containing silicon oxide film (SiOC) with a dielectric constant of 3 or less, is formed on a substrate (not shown). A resist is then coated on the first insulating film 101 and formed into a pattern of a wiring groove using a lithographic method. Then, the wiring groove is formed by dry etching through the pattern as a mask. The resist is then removed by ashing, and the wiring groove is formed in the first insulating film 101. The barrier metal 102, made up of TaN, is subsequently formed in the wiring groove by sputtering. The conductive film 103, made up of Cu, is filled in the wiring groove by electroplating. Excess parts of the barrier metal 102 and the conductive film 103 which stick out from the wiring groove are subsequently removed by chemical mechanical polishing (CMP). The first metal wire 104, made up of the barrier metal 102 and the conductive film 103, is thus formed.

Figure 2B:
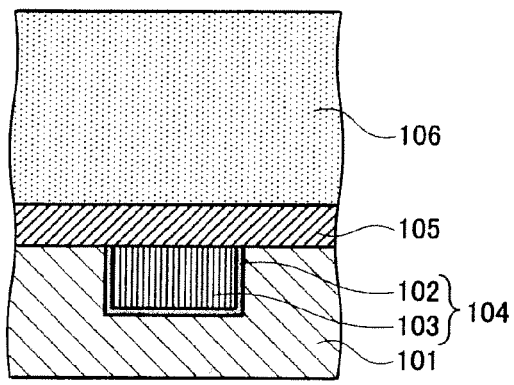
FIG. 2B is a sectional view showing a step of the method of manufacturing the semiconductor device according to the first embodiment of the present invention.

Now, as shown in FIG. 2B, the second insulating film 105 is formed on the first insulating film 101 so as to cover the first metal wire 104 using a chemical vapor deposition (CVD) method; the second insulating film 105 is made up of SiCN containing carbon and nitrogen, and functions as a metal diffusion preventing film. The third insulating film 106, made up of SiOC with a dielectric constant of 3 or less, is further formed on the second insulating film 105 using the CVD method.

Figure 2C:
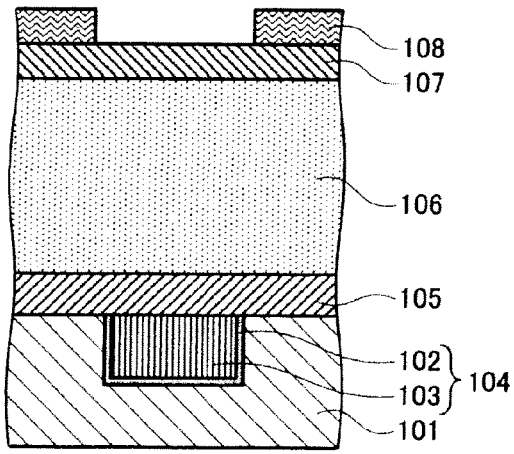
FIG. 2C is a sectional view showing a step of the method of manufacturing the semiconductor device according to the first embodiment of the present invention.
Figure 2D:
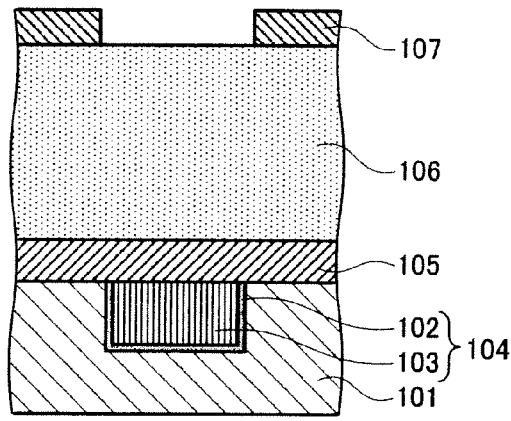
FIG. 2D is a sectional view showing a step of the method of manufacturing the semiconductor device according to the first embodiment of the present invention.

Then, as shown in FIG. 2C, a metal hard mask 107 made up of TiN is sputtered on the third insulating film 106. A resist 108 is further coated on the surface of the metal hard mask 107 and formed into a pattern of a second wire using the lithographic method. Then, as shown in FIG. 2D, the metal hard mask 107 is dry-etched through the resist pattern 108 as a mask. The wire pattern is then transferred to the metal hard mask 107. The resist pattern 108 is subsequently removed by ashing and cleaning. FIG. 2D shows that the resist 108 has been removed.

Figure 2E:
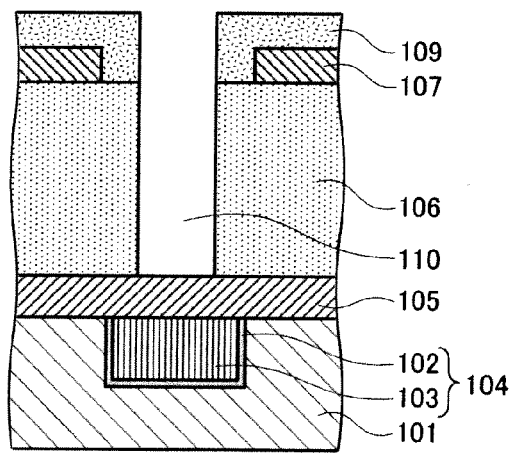
FIG. 2E is a sectional view showing a step of the method of manufacturing the semiconductor device according to the first embodiment of the present invention.
Figure 2F:
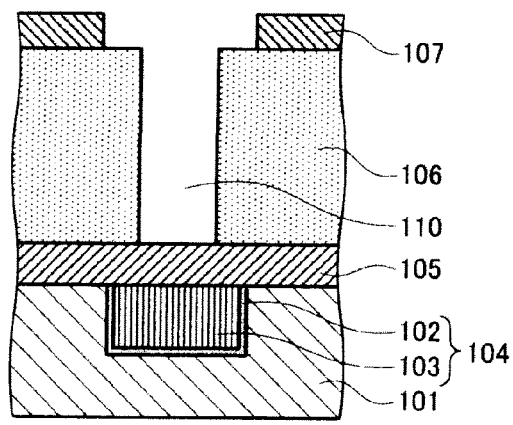
FIG. 2F is a sectional view showing a step of the method of manufacturing the semiconductor device according to the first embodiment of the present invention.

Then, as shown in FIG. 2E, a resist 109 is coated on the metal hard mask 107 and the third insulating film 106 and then formed into a via pattern using lithography. A via hole 110 is then formed in the third insulating film 106 by dry etching. After the formation of the via hole 110, the via forming resist pattern is removed by ashing and cleaning as shown in FIG. 2F.

Figure 3A:
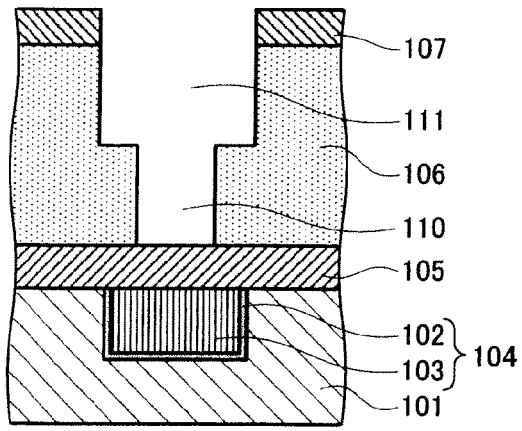
FIG. 3A is a sectional view showing a step of the method of manufacturing the semiconductor device according to the first embodiment of the present invention.
Figure 3B:
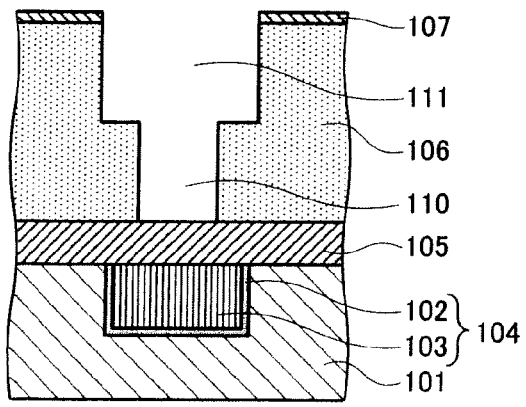
FIG. 3B is a sectional view showing a step of the method of manufacturing the semiconductor device according to the first embodiment of the present invention.
Figure 3C:
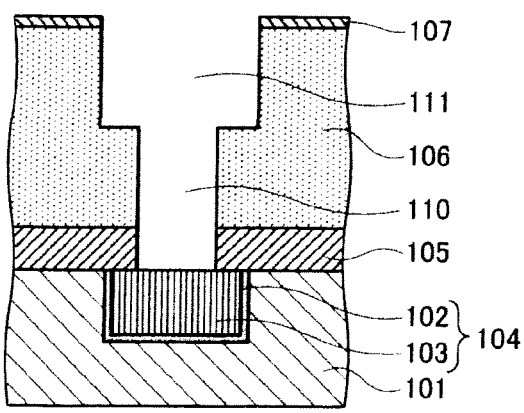
FIG. 3C is a sectional view showing a step of the method of manufacturing the semiconductor device according to the first embodiment of the present invention.

Then, as shown in FIG. 3A, a wiring groove 111 is formed in the third interlayer insulating film 106 by dry etching in accordance with the pattern formed on the metal hard mask 107. Then, as shown in FIG. 3B, a part of the metal hard mask 107 is polished and removed by CMP; the part of the metal hard mask 107 is thinned so as to reduce the film thickness thereof to about half. Subsequently, as shown in FIG. 3C, an opening is formed in the second insulating film 105 by dry etching.

At this time, the metal hard mask 107 is slightly thinned. However, the metal hard mask 107 may be further partly removed and thinned by dry etching or CMP. Furthermore, at this time, all of the metal hard mask 107 may be removed by dry etching or CMP.

Figure 3D:
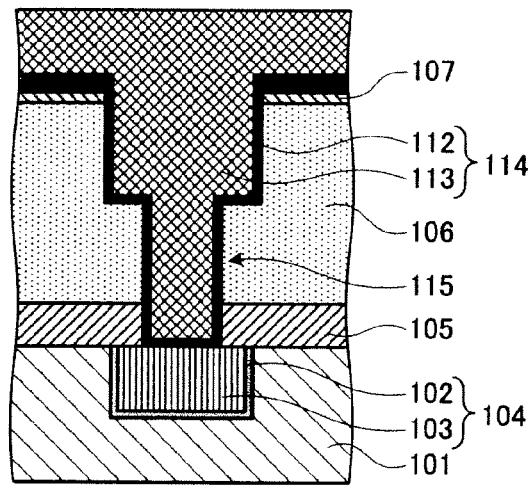
FIG. 3D is a sectional view showing a step of the method of manufacturing the semiconductor device according to the first embodiment of the present invention.

Then, as shown in FIG. 3D, the barrier metal 112, made up of TaN, is formed in the via hole 110 and the wiring groove 111 by sputtering. The conductive film 113, made up of Cu, is then formed by electroplating.

Figure 3E:
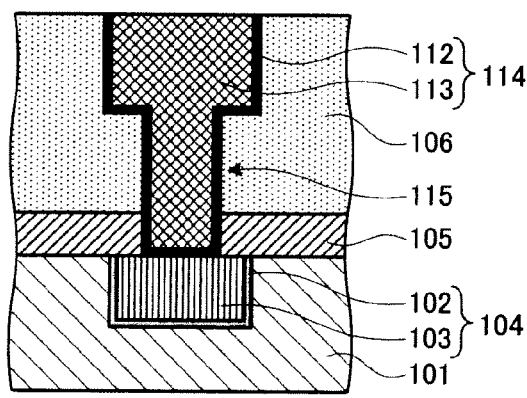
FIG. 3E is a sectional view showing a step of the method of manufacturing the semiconductor device according to the first embodiment of the present invention.

Subsequently, as shown in FIG. 3E, excess parts of the barrier metal 112 and the conductive film 113 which stick out from the wiring groove 111 are removed by CMP. The via 115 and second metal wire 114, made up of the barrier metal 112 and conductive film 113, are thus formed. The first metal wire 104 and the second metal wire 114 are electrically connected together via the via 115. At this time, if any part of the metal hard mask 107 remains, that part is completely removed.

Figure 3F:
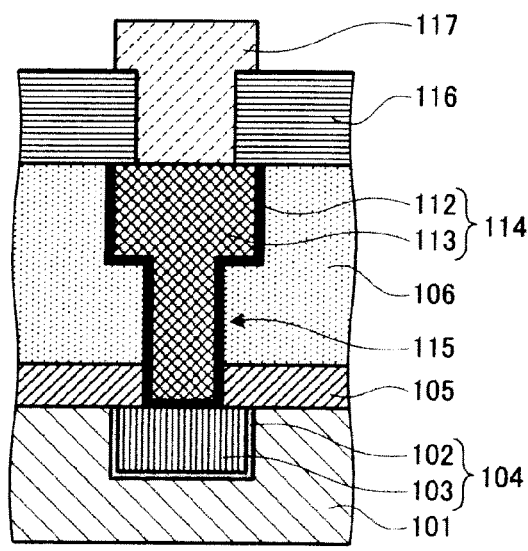
FIG. 3F is a sectional view showing a step of the method of manufacturing the semiconductor device according to the first embodiment of the present invention.

Finally, the fourth insulating film 116, made up of SiN, is formed. An opening is formed in the fourth insulating film 116 by lithography and dry etching. The pad electrode 117, made up of Al, is formed in the opening (FIG. 3F).

As described above, by using the metal hard mask to remove the resist, then forming the wiring groove, and thinning or removing the metal hard mask by polishing before forming the barrier metal and the conductive film, it is possible to inhibit damage to the low-dielectric-constant insulating film caused by the removal of the resist. A reduction in CMP time also makes it possible to inhibit the damage to the low-dielectric-constant insulating film. Moreover, a reduction in variation in polishing makes it possible to reduce a variation in electrical characteristics.

Description will be given below of the effects, on the variation in electrical characteristics and the inter-wire leakage characteristic, of the process of removing the metal hard mask 107 by polishing before forming the barrier metal 112 and the conductive film 113. Three samples were produced; one of the samples was produced in accordance with the manufacturing method of forming the wiring structure by polishing the metal hard mask 107 before forming the barrier metal 112 and the conductive film 113 in the wiring groove 111 according to the method shown in the present embodiment, another sample was produced in accordance with the manufacturing method of forming the wiring structure by forming the barrier metal 112 and the conductive film 113 in the wiring groove 111, then subjecting the conductive film 113 to CMP, and then subjecting the barrier metal 112 to CMP while simultaneously removing the metal hard mask 107 by CMP, and yet another sample was produced in accordance with the manufacturing method of forming the wiring structure using the conventional insulating film hard mask. For each of the samples, the wiring resistance was measured at 50 points in a wafer surface using a pattern of wiring width 100 nm and separation width 100 nm. FIG. 4 shows the results of the measurement. FIG. 5 shows the results of measurement of the inter-wire leakage current in the pattern.

FIG. 4 shows that the sample having the wiring structure formed using the insulating film hard mask offered a low, significantly varying wiring resistance. This is because during the processing of the wiring groove, the shape of the insulating film hard mask changed to increase the opening width of the upper part of the wiring groove and thus the cross section of the wire. The wiring resistance values in FIG. 4 are normalized to a target value.

For one of the samples having the wiring structure formed using the metal hard mask, that is, the sample formed using the method of avoiding removing a part of the metal hard mask by polishing, the wiring resistance exhibited the target value but varied significantly. On the other hand, for the sample having the wiring structure formed by the method shown in the present embodiment, the wiring resistance exhibited the target value and was inhibited from varying significantly. A difference between the two samples is the film thickness of the metal hard mask polished simultaneously with the CMP of the barrier metal. The results of the measurement indicate that the electrical characteristics are stabilized by reducing the total film thickness of the polished film.

In the comparison of the inter-wire leakage current characteristic, shown in FIG. 5, an equivalent characteristic was exhibited by the sample formed using the method of avoiding pre-removing a part of the metal hard mask by polishing and the sample formed using the insulating film hard mask. However, the sample with the insulating film hard mask exhibited a slightly higher breakdown electric field strength. This is assumed to be due to a difference in damage induced on the surface of the low-dielectric-constant film. On the other hand, the sample having the wiring structure formed by the method shown in the present embodiment exhibited the lowest inter-wire leakage current and the highest breakdown electric field strength. This indicates that pre-polishing the metal hard mask reduces possible damage induced on the surface of the low-dielectric-constant film and thus a possible leakage current.

Now, a second embodiment of the present invention will be described with reference to FIGS. 9A, 9B, 9C, 9D, 10A, 10B, 10C, and 10D. A sectional view of a semiconductor device formed according to the present embodiment is the same as that shown in FIG. 1. Sectional views showing the steps, from the beginning through the formation of a via hole, of a method of manufacturing the semiconductor device of the present invention according to the present embodiment are the same as FIGS. 2A, 2B, 2C, 2D, 2E, and 2F described in the first embodiment.

The method of manufacturing the semiconductor device according to the second embodiment will be described with reference to FIGS. 9A, 9B, 9C, 9D, 10A, 10B, 10C, and 10D.

FIGS. 9A, 9B, 9C, 9D, 10A, 10B, 10C, and 10D are sectional views showing the steps of the method of manufacturing the semiconductor device according to the second embodiment of the present invention.

Figure 9A:
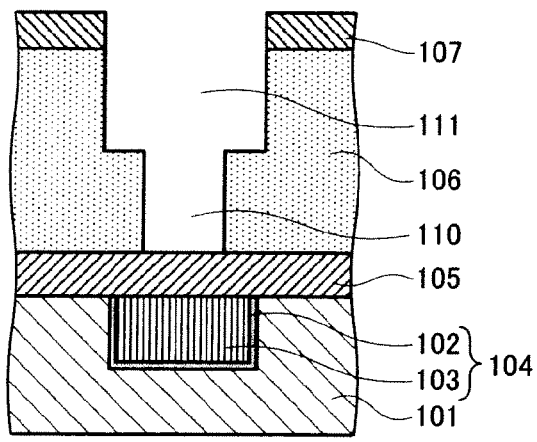
FIG. 9A is a sectional view showing a step of a method of manufacturing a semiconductor device according to a second embodiment of the present invention.
Figure 9C:
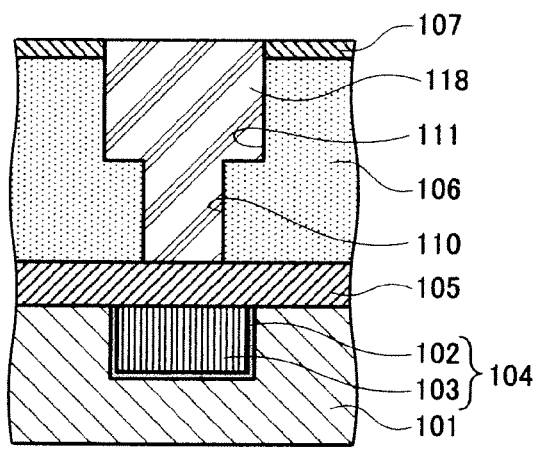
FIG. 9C is a sectional view showing a step of the method of manufacturing the semiconductor device according to the second embodiment of the present invention.
Figure 9B:
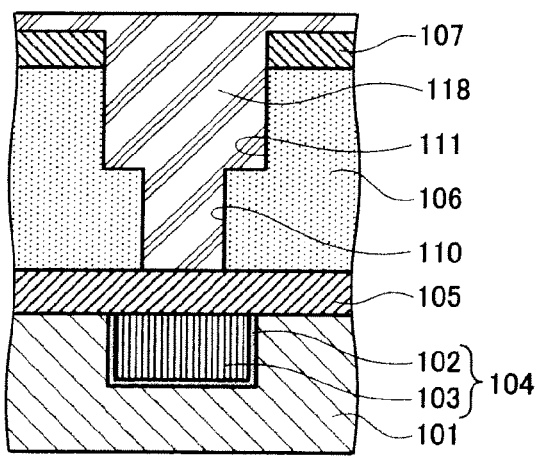
FIG. 9B is a sectional view showing a step of the method of manufacturing the semiconductor device according to the second embodiment of the present invention.
Figure 9D:
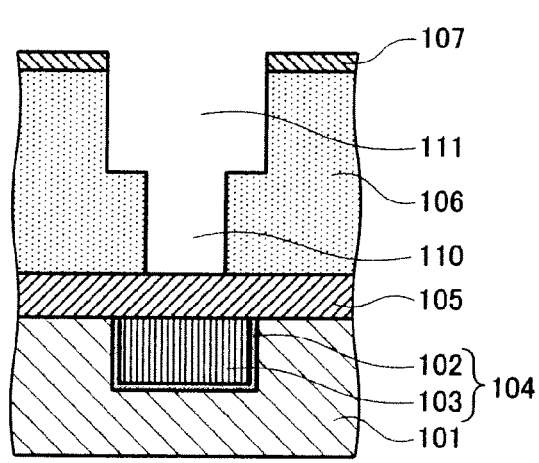
FIG. 9D is a sectional view showing a step of the method of manufacturing the semiconductor device according to the second embodiment of the present invention.
Figure 10A:
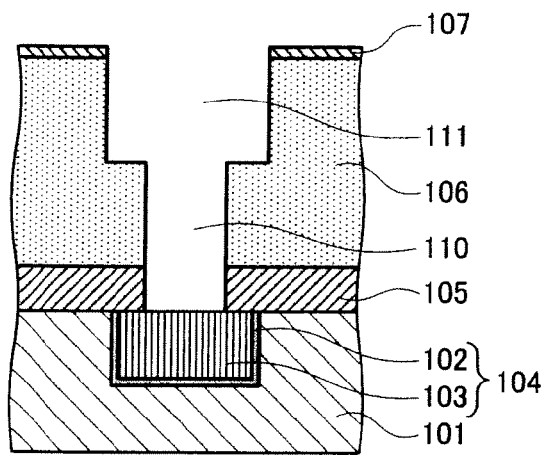
FIG. 10A is a sectional view showing a step of the method of manufacturing the semiconductor device according to the second embodiment of the present invention.

The steps from the beginning of the method through the formation of the via hole of the present method are the same as the manufacturing method described in the first embodiment, shown in FIGS. 2A, 2B, 2C, 2D, 2E, and 2F. The description of these steps is thus omitted. After the via hole is formed as shown in FIG. 2F, the wiring groove 111 is formed in the third interlayer insulating film 106 by dry etching in accordance with the pattern formed on the metal hard mask 107 as shown in FIG. 9A. Then, as shown in FIG. 9B, a burial material 118 made up of an organic material is applied into the opening using a spin-coating method. Then, as shown in FIG. 9C, a part of the metal hard mask 107 is polished and removed by CMP; the part of the metal hard mask 107 is thinned so as to reduce the film thickness thereof to about half. Subsequently, as shown in FIG. 9D, the burial material 118 is removed by dry etching or ashing. Then, as shown in FIG. 10A, an opening is formed in the second insulating film 105 by dry etching.

At this time, the metal hard mask 107 is slightly thinned. However, the metal hard mask 107 may further be partly removed and thinned by dry etching or CMP. Furthermore, at this time, all of the metal hard mask 107 may be removed by dry etching or CMP.

Figure 10B:
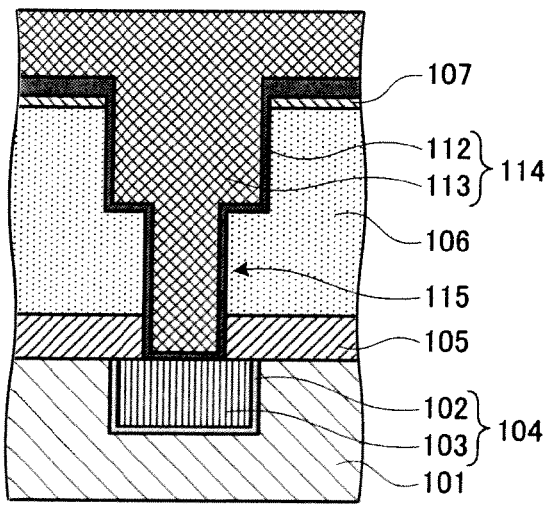
FIG. 10B is a sectional view showing a step of the method of manufacturing the semiconductor device according to the second embodiment of the present invention.

Then, as shown in FIG. 10B, the barrier metal 112, made up of TaN, is formed in the via hole 110 and the wiring groove 111 by sputtering. The conductive film 113, made up of Cu, is then formed by electroplating.

Figure 10C:
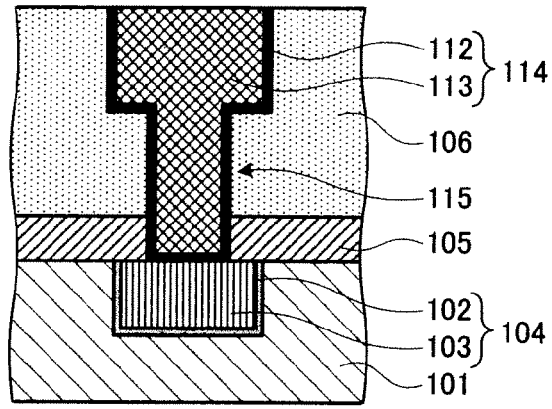
FIG. 10C is a sectional view showing a step of the method of manufacturing the semiconductor device according to the second embodiment of the present invention.

Subsequently, as shown in FIG. 10C, excess parts of the barrier metal 112 and the conductive film 113 which stick out from the wiring groove 111 are removed by CMP. The via 115 and second metal wire 114, made up of the barrier metal 112 and conductive film 113, are thus formed. The first metal wire 104 and the second metal wire 114 are electrically connected together via the via 115. At this time, if any part of the metal hard mask 107 remains, that part is completely removed.

Figure 10D:
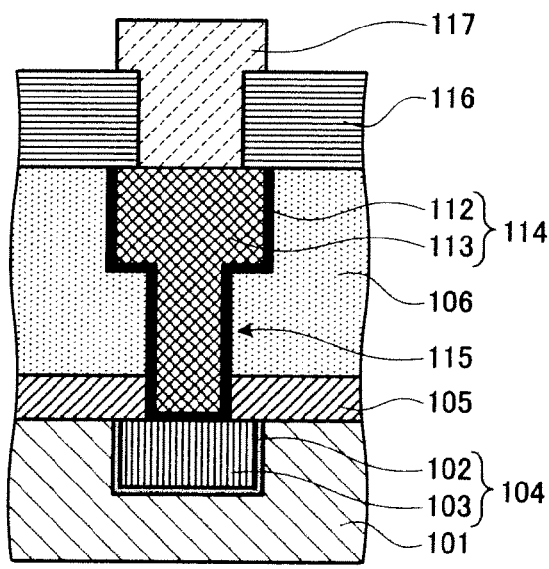
FIG. 10D is a sectional view showing a step of the method of manufacturing the semiconductor device according to the second embodiment of the present invention.

Finally, the fourth insulating film 116, made up of SiN, is formed. An opening is formed in the fourth insulating film 116 by lithography and dry etching. The pad electrode 117, made up of Al, is formed in the opening (FIG. 10D).

The above-described method enables the semiconductor device with the sectional structure shown in FIG. 1 to be formed as is the case with the first embodiment. The semiconductor device obtained exerts effects similar to those of the semiconductor device according to the first embodiment, in terms of electrical characteristics and reliability characteristics. In particular, the manufacturing method according to the second embodiment is characterized in that before the metal hard mask is partly removed as shown in FIG. 9C, the burial material 118 has been filled into the openings including the wiring groove 111 and the via hole 110. Without the burial material, it is assumed that polishing chips may enter the openings and remain there in spite of cleaning. However, the burial material 118 filled in the openings prevents polishing chips from the removed hard mask material from entering the openings and thus from remaining.

In the present embodiment, the method has been shown which, in the process of forming the wiring structure using the metal hard mask, removes a part of the metal hard mask before the barrier metal and the conductive film are formed. However, the part may be similarly pre-removed by the process of forming the wiring structure using the insulating film hard mask. In this case, the total thickness of the film polished by CMP can be reduced, exerting the effect of reducing a possible leakage current as shown in FIG. 5.

Furthermore, as a hard mask material, the metal material is more excellent than the insulating film material in that the metal material has the property of blocking transmission of light. That is, since the low-dielectric-constant film generally has a low mechanical strength, the mechanical strength is increased by irradiating the film with UV light and so on. The metal hard mask prevents the transmission of light from any of various light sources used for the lithographic step and thus the irradiation, with the UV light, of the low-dielectric-constant film located immediately below the metal hard mask, thereby preventing the low-dielectric-constant film from being modified.

In the present embodiment, the wiring groove 111 is formed in the third insulating film 106 after the formation of the via hole 110. However, similar effects are exerted by forming the via hole 110 after forming the wiring groove 111 in the third insulating film 106 using the metal hard mask 107. In this case, the metal hard mask 107 may be thinned by CMP before the formation of the via resist pattern 109, used to form the via hole 110. This method reduces the height of a surface step present before the application of the via forming resist 109. Consequently, the pattern resolution accuracy during the lithography step can be increased.

Furthermore, as the manufacturing method of forming the first wire in the first insulating film, instead of the resist mask process, the metal hard mask may be used as is the case with the formation of the second wire.

Furthermore, in the description of the embodiment of the present invention, the metal hard mask is used to form the global wire connected to the pad. However, the metal hard mask according to the present embodiment may further be used to form the wire in the lower layer.

Furthermore, in the above-described embodiments, the metal hard mask is formed on the third insulating film. However, the metal hard mask may be formed after a film having a higher mechanical strength than the third insulating film has been formed on the third insulating film. This configuration makes it possible to prevent the third insulating film, having a low dielectric constant and a low mechanical strength, from being exposed during CMP. This reduces defects such as scratch or damage induced by CMP, further improving reliability.

Furthermore, the manufacturing methods according to the above-described embodiments use the metal hard mask to pattern the wiring groove. This makes it possible to prevent resist poisoning, which is a problem with the resist mask process. As a result, a reliable semiconductor device can be provided.

Moreover, the use of the metal hard mask allows light to be blocked by the metal hard mask. This is also effective for preventing a possible increase in dielectric constant caused by the irradiation of an excessive quantity of UV light during the conventional lithography step using the resist mask or insulating film hard mask.

What is claimed is:

1. A method of manufacturing a semiconductor device, comprising:
   forming an insulating film on a semiconductor substrate or on a lower wiring layer;
   depositing a hard mask on the insulating film;
   forming in the hard mask an opening for a wiring pattern;
   forming in the insulating film a wiring groove through the hard mask;
   filling the opening in the hard mask with an organic film;
   thinning the hard mask;
   forming a barrier metal and a conductive film in the wiring groove; and
   removing parts of the barrier metal and the conductive film which protrude from the wiring groove.

2. The method of manufacturing the semiconductor device according to claim 1, further comprising removing all of the hard mask, between the step of filling the opening in the hard mask with an organic film and the step of forming the barrier metal and the conductive film.

3. The method of manufacturing the semiconductor device according to claim 2, wherein thinning the hard mask or removing the entire hard mask is carried out by CMP.

4. The method of manufacturing the semiconductor device according to claim 2, wherein thinning the hard mask or removing the entire hard mask is carried out by etching.

5. The method of manufacturing the semiconductor device according to claim 1, wherein the hard mask contains at least one of Ti, TiN, Ta, and TaN.

6. The method of manufacturing the semiconductor device according to claim 2, wherein the hard mask contains at least one of Ti, TiN, Ta, and TaN.

7. The method of manufacturing the semiconductor device according to claim 3, wherein the hard mask contains at least one of Ti, TiN, Ta, and TaN.

8. The method of manufacturing the semiconductor device according to claim 4, wherein the hard mask contains at least one of Ti, TiN, Ta, and TaN.

* * * * *